(12) United States Patent
Nakajima et al.

(10) Patent No.: US 10,305,362 B2
(45) Date of Patent: May 28, 2019

(54) SEMICONDUCTOR DEVICE

(71) Applicant: FUJI ELECTRIC CO., LTD., Kawasaki (JP)

(72) Inventors: Hiroyuki Nakajima, Matsumoto (JP); Takanori Kohama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 41 days.

(21) Appl. No.: 15/610,111

(22) Filed: May 31, 2017

(65) Prior Publication Data
US 2017/0373583 A1 Dec. 28, 2017

(30) Foreign Application Priority Data

Jun. 28, 2016 (JP) .................................. 2016-127321
Mar. 31, 2017 (JP) .................................. 2017-071210

(51) Int. Cl.
*H03K 17/687* (2006.01)
*H02M 1/08* (2006.01)
*H02M 3/156* (2006.01)

(52) U.S. Cl.
CPC ............. *H02M 1/08* (2013.01); *H02M 3/156* (2013.01)

(58) Field of Classification Search
None
See application file for complete search history.

(56) References Cited

U.S. PATENT DOCUMENTS

| 6,222,355 | B1* | 4/2001 | Ohshima | ............ | H03K 17/0822 |
| | | | | | 323/282 |
| 6,392,908 | B2* | 5/2002 | Miyazaki | ........... | H03K 17/0822 |
| | | | | | 363/132 |
| 2001/0015670 | A1* | 8/2001 | Sakai | ..................... | H02M 1/08 |
| | | | | | 327/434 |
| 2004/0011342 | A1 | 1/2004 | Fukatsu | | |
| 2015/0365070 | A1 | 12/2015 | Kohama | | |

FOREIGN PATENT DOCUMENTS

| JP | 2004-36438 | 2/2004 |
| JP | 2014-187543 | 10/2014 |
| JP | 2016-1635 | 1/2016 |

* cited by examiner

*Primary Examiner* — Long Nguyen

(57) ABSTRACT

A semiconductor device includes an element drive unit configured to control a control terminal of a voltage-control type semiconductor element using the control signal as input, the element drive unit including a control circuit that is driven using the control signal as a power supply. The element drive unit includes: a first voltage divider circuit that is connected between an input terminal to which the control signal is input and a low potential side terminal connected to a low potential side terminal of the voltage-control type semiconductor element and is configured such that a first divided voltage is not greater than a set voltage; a semiconductor switching element configured to control the first voltage divider circuit; and a second voltage divider circuit for making the semiconductor switching element conductive. The first divided voltage is supplied to the control terminal of the voltage-control type semiconductor element and the control circuit.

16 Claims, 8 Drawing Sheets

SEMICONDUCTOR DEVICE

CROSS REFERENCE TO RELATED APPLICATIONS AND INCORPORATION BY REFERENCE

This application claims benefit of priority under 35 USC 119 based on Japanese Patent Application Nos. 2017-071210 and 2016-127321, filed on Mar. 31, 2017 and Jun. 28, 2016 respectively, the entire contents of which are incorporated by reference herein.

TECHNICAL FIELD

The present invention relates to a semiconductor device including a voltage-control type semiconductor element that drives a load.

BACKGROUND ART

A semiconductor device of this type includes a voltage-control type semiconductor element that is made up of an IGBT (Insulated Gate Bipolar Transistor), a power MOS-FET (Metal-Oxide-Semiconductor Field-Effect Transistor), or the like.

As described in, for example, JP 2004-36438 A, when such a semiconductor device is used as an ignition device of an internal combustion engine mounted to a vehicle, one end of the primary side of an ignition coil is connected to a battery and the other end is grounded via the voltage-control type semiconductor element. When the voltage-control type semiconductor element is to be turned on, an ignition signal of a predetermined voltage is supplied, as a gate signal, from an external control device to the gate of the voltage-control type semiconductor element through a gate resistor to cause a gate voltage to rise and the voltage-control type semiconductor element to be turned on.

On the other hand, when the voltage-control type semiconductor element is to be turned off, electric charges accumulated in the gate capacitance of the voltage-control type semiconductor element are discharged to the external control device side.

The semiconductor device includes protection control circuits, such as an operation level setting circuit, a thermal shut-off circuit, and a current limit circuit, that operate using the ignition signal as a power supply voltage.

As described in JP 2016-1635 A, to compensate an instantaneous drop in the power supply voltage supplied to digital circuits, analog circuits, and a power device drive circuit that constitute the protection control circuits, adding a low pass filter circuit to each of the circuits has been proposed.

SUMMARY OF INVENTION

In the conventional examples described in JP 2004-36438 A and JP 2016-1635 A, various control circuits are operated using an ignition signal as a power supply voltage, and an instantaneous drop in the power supply voltage occurring in such an environment can be coped using low pass filter circuits.

However, when a voltage between an input terminal and a control terminal of a voltage-control type semiconductor element exceeds a set voltage for protecting the voltage-control type semiconductor element and various control circuits due to a short-to-supply (a state of being connected to a power supply) and the like, the voltage-control type semiconductor element and the various control circuits may not be protected.

Accordingly, the present invention is made by focusing on the above-described problem in the conventional examples, and an object of the present invention is to provide a semiconductor device that is capable of, by suppressing at least a voltage of a control signal supplied to a voltage-control type semiconductor element from increasing, protecting the voltage-control type semiconductor element and various control circuits from such a voltage increase.

In order to achieve the object mentioned above, according to an aspect of the present invention, there is provided a semiconductor device including: a voltage-control type semiconductor element configured to drive a load; and an element drive unit to which a control signal for a control terminal of the voltage-control type semiconductor element is input and configured to control the control terminal of the voltage-control type semiconductor element using the control signal, the element drive unit including a control circuit that is driven using the control signal as a power supply. The element drive unit includes: an input terminal to which the control signal is input and a low potential side terminal to which a low potential side terminal of the voltage-control type semiconductor element is connected; a first voltage divider circuit that is connected between the input terminal and the low potential side terminal and is configured such that a first divided voltage is not greater than a set voltage for protecting the voltage-control type semiconductor element and the control circuit; a semiconductor switching element configured to control a voltage dividing operation performed by the first voltage divider circuit; and a second voltage divider circuit configured to, when a voltage that exceeds the set voltage is input to the input terminal, output a second divided voltage to a control terminal of the semiconductor switching element, the second divided voltage making the semiconductor switching element conductive. The first divided voltage is supplied to the control terminal of the voltage-control type semiconductor element and the control circuit.

According to one aspect of the present invention, when a short-to-supply and the like occur at an input terminal, it may be possible to, by suppressing a control voltage between a control terminal of a voltage-control type semiconductor element and the input terminal from increasing exceeding a set voltage, protect the voltage-control type semiconductor element and various control circuits securely.

The object and advantages of the invention will be realized and attained by means of the elements and combinations particularly pointed out in the claims. It is to be understood that both the foregoing general description and the following detailed description are exemplary and explanatory and are not restrictive of the invention.

DESCRIPTION OF EMBODIMENTS

An embodiment of the present invention will now be described with reference to the drawings. In the following description of the drawings, the same or similar reference signs are assigned to the same or similar constituent components.

In addition, the following embodiments exemplify devices and methods to embody the technical idea of the present invention, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

Hereinafter, an ignition control device for an internal combustion engine, the ignition control device including a semiconductor device according to a first embodiment of the present invention, will be described using FIG. 1.

Figure 1:
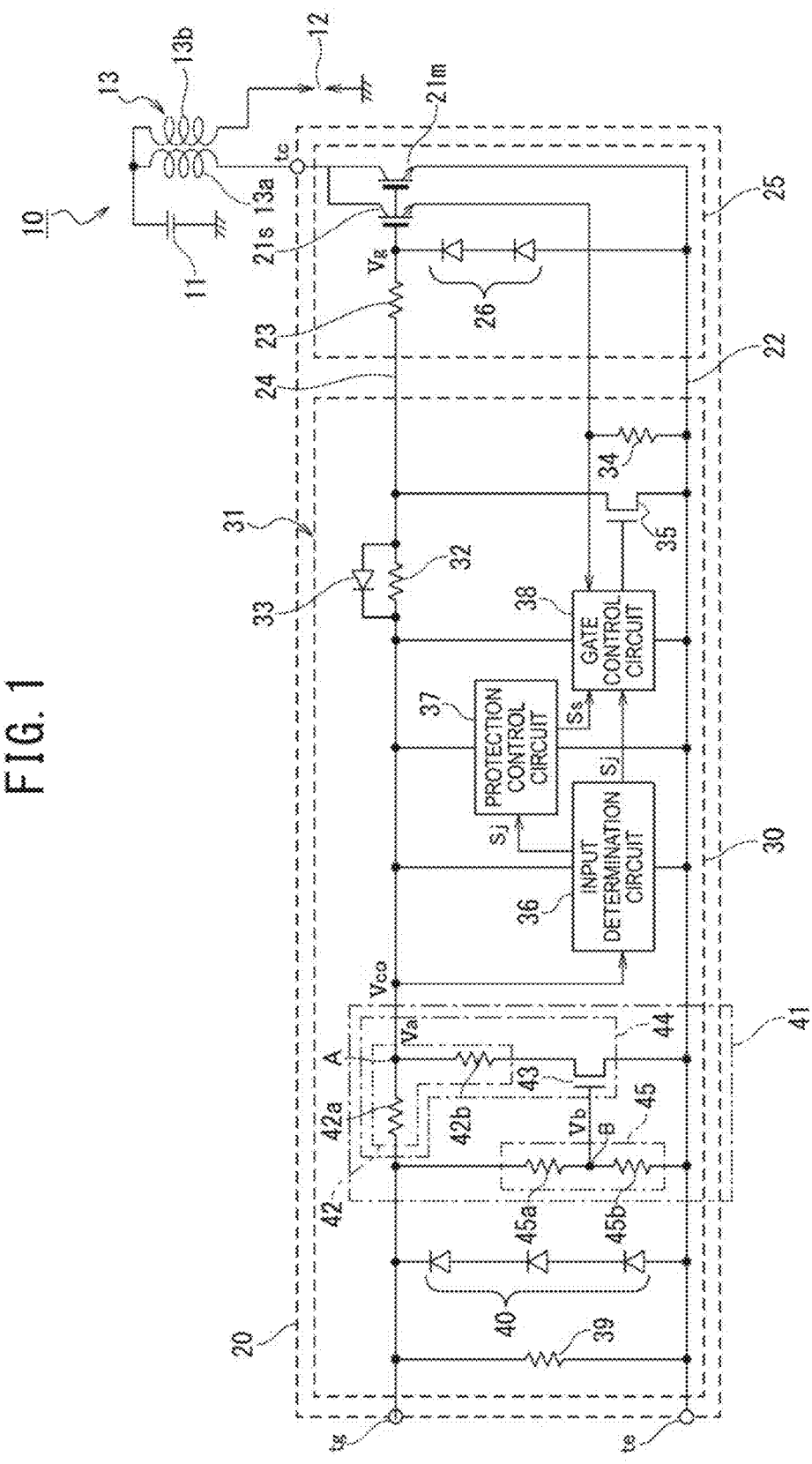
FIG. 1 is a circuit diagram illustrative of an ignition control device for an internal combustion engine that includes a semiconductor device according to a first embodiment of the present invention.

An ignition control device 10 for an internal combustion engine includes an ignition coil 13 to the primary side of which a power supply voltage is applied from a battery 11, to the secondary side of which an ignition device 12 that is made up of an ignition plug is connected, and that serves as an inductive load, as illustrated in FIG. 1. To the opposite side of the primary side of the ignition coil 13 to the battery 11, a semiconductor device 20 that constitutes, for example, a two chip igniter is connected. To the semiconductor device 20, a control signal that serves as an ignition signal is supplied from an external device, for example, a control device.

The semiconductor device 20 includes a collector terminal tc that is connected to the opposite side of a primary coil 13a of the ignition coil 13 to the battery 11 and serves as a high potential side terminal, an emitter terminal to that is connected to a ground and serves as a low potential side terminal, and a gate terminal tg that is connected to the external control device and serves as an input terminal.

Between the collector terminal tc and emitter terminal te of the semiconductor device 20, a main IGBT (Insulated Gate Bipolar Transistor) 21m that is a voltage-control type semiconductor element is connected. The main IGBT 21m has a collector, which serves as a high potential side terminal, connected to the collector terminal tc and an emitter, which serves as a low potential side terminal, connected to the emitter terminal te via a low potential side wiring 22. In addition, the main IGBT 21m has a gate, which serves as a control terminal, connected to the gate terminal tg via a gate resistor 23 and a control wiring 24 that serves as a supply path of a control signal.

The gate resistor 23 constitutes a filter with parasitic gate capacitance of the main IGBT 21m to suppress high-frequency components such that oscillation is made less likely to be generated in control of gate voltage.

In addition, a sense IGBT 21s for current detection is connected in parallel with the main IGBT 21m. The collector, gate, and emitter of the sense IGBT 21s are connected to the collector of the main IGBT 21m, the gate of the main IGBT 21m, and the low potential side wiring 22 via a current detecting resistor 34 that is formed in a control semiconductor chip 30, which will be described later, respectively.

The main IGBT 21m, the sense IGBT 21s, and the gate resistor 23 are formed in a single power semiconductor chip 25. The power semiconductor chip 25 is required to be protected against electro-static discharge (hereinafter, referred to as ESD) caused by mechanical contact therewith in package assembling and contact therewith by a person after having been packaged into a product and thus has, for example, two Zener diodes 26 connected between the connection point of the gate resistor 23 and the gate of the sense IGBT 21s and the low potential side wiring 22.

The main IGBT 21m and the sense IGBT 21s are controlled by an element drive unit 31 that is formed in the control semiconductor chip 30, which is separate from the power semiconductor chip 25.

The element drive unit 31 has a resistor 32 connected to the control wiring 24 in series with the gate resistor 23, the resistor 32 having a resistance value higher than the resistance value of the gate resistor 23. As an example, the resistance value of the resistor 32 is set at a comparatively high value, for example, in the order of several KΩ, and the resistance value of the gate resistor 23 is set at a comparatively low value, for example, in the order of several tens of Ω.

To the resistor 32, a speed-up diode 33 for speeding up a turn-off of the main IGBT 21m and the sense IGBT 21s is connected in parallel with the resistor 32. The anode and cathode of the diode 33 are connected to a portion of the control wiring 24 between the resistor 32 and the gate resistor 23 and a portion of the control wiring 24 between the resistor 32 and the gate terminal tg, respectively. Although an example of the diode 33 is a PN junction diode, a Schottky barrier diode the forward voltage of which is lower than that of the PN junction diode may also be applied.

The element drive unit 31 includes the current detecting resistor 34 the one end of which is connected to the emitter of the sense IGBT 21s and the other end of which is connected between the emitter of the main IGBT 21m and the emitter terminal te.

The element drive unit 31 also includes a semiconductor switching element 35 that is connected between a portion of the control wiring 24 between the resistor 32 and the gate resistor 23 and the low potential side wiring 22 between the emitter of the main IGBT 21m and the emitter terminal te, is used for current limitation, and is made up of, for example, an N-channel MOSFET.

In addition, the element drive unit 31 includes an input determination circuit 36, a protection control circuit 37, and a gate control circuit 38 to each of which a control voltage (for example, 5 V) between the resistor 32 and a resistor 42a of a first voltage divider circuit, which will be described later, is supplied as a power supply voltage and that serve as control circuits.

The input determination circuit 36 determines whether a control voltage Vco based on a gate signal that is supplied to the gate terminal tg from an external control device is not lower than a preset threshold voltage Vth of the igniter. The input determination circuit 36 outputs, for example, an input determination signal Sj of a low level when the control voltage Vco is lower than the threshold voltage Vth and, outputs, for example, an input determination signal Sj of a high level when the control voltage Vco is not lower than the threshold voltage Vth.

The protection control circuit 37, by collecting a detection signal from a temperature sensor that is a diode or the like incorporated in the power semiconductor chip 25, outputs a shut-off signal Ss to the gate control circuit 38 when the temperature of the main IGBT 21$m$ has increased to a high temperature that is a set temperature or higher.

The protection control circuit 37 also detects a situation in which an abnormality has occurred to an external control device and an overlong gate signal is caused to be input based on the input determination signal Sj, which is input from the input determination circuit 36. That is, the protection control circuit 37 counts an on-time duration of a gate signal that is applied to the gate terminal tg, which serves as an input terminal, using a timer circuit and, when the on-time duration reaches a predefined period, outputs the shut-off signal Ss, which controls the semiconductor switching element 35 to the gate control circuit 38 such that a gate voltage Vg of the main IGBT 21$m$ and the sense IGBT 21$s$ turns to a low level.

To the gate control circuit 38, a terminal voltage at the connection point of the emitter of the sense IGBT 21$s$ and the current detecting resistor 34 is input as a current detection value and, in conjunction therewith, the input determination signal Sj, which is output from the input determination circuit 36, and the shut-off signal Ss, which is output from the protection control circuit 37, are input.

When the input determination signal Sj is at a low level, the gate control circuit 38 controls the semiconductor switching element 35 to the ON state to keep the gate voltage Vg, which is supplied to the gates of the main IGBT 21$m$ and the sense IGBT 21$s$, at a low potential. For this reason, the main IGBT 21$m$ and the sense IGBT 21$s$ are kept in the OFF state.

On the other hand, when the input determination signal Sj is at a high level, the gate control circuit 38 controls the semiconductor switching element 35 to the OFF state to allow the gate signal to be supplied to the gates of the main IGBT 21$m$ and the sense IGBT 21$s$.

Further, when the shut-off signal Ss of a high level is input from the protection control circuit 37, the gate control circuit 38 controls the semiconductor switching element 35 to the ON state to keep the gate voltage Vg, which is supplied to the gates of the main IGBT 21$m$ and the sense IGBT 21$s$, at a low potential. For this reason, the main IGBT 21$m$ and the sense IGBT 21$s$ are turned off.

The gate control circuit 38 also operates as a current limit circuit. That is, when a collector current Ic flowing into the main IGBT 21$m$ reaches a current limit value $I_{LIM}$, the gate control circuit 38 controls the semiconductor switching element 35 to the ON state such that the collector current Ic is kept at the current limit value $I_{LIM}$. The above operation controls the gate voltage Vg of the main IGBT 21$m$ and the sense IGBT 21$s$ to be lowered to protect the main IGBT 21$m$ from destruction due to generated heat.

The element drive unit 31 also includes a pull-down resistor 39 that is connected between the control wiring 24, which is wired on the side where the gate terminal tg, which serves as an input terminal, is disposed, and the low potential side wiring 22, which is wired on the side where the emitter terminal te, which serves as a low potential side terminal, is disposed. The pull-down resistor 39 defines an input impedance of the gate terminal tg.

Further, as with the power semiconductor chip 25, the control semiconductor chip 30 is also required to be protected against ESD (electro-static discharge) caused by mechanical contact therewith in package assembling and contact therewith by a person after having been packaged into a product and thus is connected with, for example, a Zener diode group 40 obtained by connecting in series three Zener diodes connected in parallel with the pull-down resistor 39.

Each of the main IGBT 21$m$ and the sense IGBT 21$s$ (which are connected to the element drive unit 31), and the input determination circuit 36, the protection control circuit 37, and the gate control circuit 38 is configured with a control system operating with a power supply voltage of 5 V. For this reason, when a short-to-supply of being connected to a power supply system from the battery 11 has occurred to the gate terminal tg, which serves as an input terminal, or the control wiring 24 and a voltage thereof exceeds a set voltage that is set at a rated voltage or an allowable upper limit voltage for protection of control systems operating with a power supply voltage of 5 V, there is a possibility that the semiconductor elements and various circuits are destroyed. In particular, with regard to an ignition device for an internal combustion engine, it is required to securely protect the constituent components of the element drive unit 31 against a short-to-supply.

For this reason, in the present embodiment, a short-to-supply protection circuit 41 that protects the main IGBT 21$m$, the sense IGBT 21$s$, and the constituent components of the element drive unit 31 against a short-to-supply is disposed between the input determination circuit 36 and the Zener diode group 40.

The short-to-supply protection circuit 41 is made up of a series circuit 44 of a first voltage divider circuit 42 and a semiconductor switching element 43 that is made up of, for example, an N-channel MOSFET and a second voltage divider circuit 45 that is connected in parallel with the series circuit 44.

In the above, the first voltage divider circuit 42 is made up of two resistors 42$a$ and 42$b$ that are connected in series. The resistor 42$a$ is interposed in the control wiring 24 between the Zener diode group 40 and the input determination circuit 36. The resistor 42$b$ is connected between the control wiring 24 between the resistor 42$a$ and the input determination circuit 36 and the low potential side wiring 22 in series with the semiconductor switching element 43.

A connection point A of the resistors 42$a$ and 42$b$ of the first voltage divider circuit 42 is connected to the control wiring 24. In other words, the control wiring 24 is connected to the gate terminal tg, which serves as an input terminal, via the resistor 42$a$ of the first voltage divider circuit 42, and the resistor 42$b$ of the first voltage divider circuit 42 is connected to the low potential side wiring 22 via the semiconductor switching element 43.

For this reason, when the semiconductor switching element 43 is in the OFF state, the first voltage divider circuit 42 does not function as a voltage divider circuit, and a gate signal that is applied to the gate terminal tg, which serves as an input terminal, is supplied as it is to the control wiring 24 on the side where the sense IGBT 21s is disposed via the resistor 42a.

On the other hand, when the semiconductor switching element 43 is in the ON state, the first voltage divider circuit 42 functions as a voltage divider circuit, and a first divided voltage Va that is determined based on a resistance value of the resistor 42a and a combined resistance value of a resistance value of the resistor 42b and an on-resistance value of the semiconductor switching element 43 is supplied to the control wiring 24 on the side where the sense IGBT 21s is disposed.

Therefore, the resistance values of the resistors 42a and 42b are set such that, when an occurrence of a short-to-supply to the gate terminal tg or the control wiring 24 causes an excessive voltage of, for example, 16 V that is a battery voltage VB of the battery 11 to be applied to the control wiring 24 on the side where the gate terminal tg is disposed, the first divided voltage Va, which is output from the connection point A of the resistors 42a and 42b of the first voltage divider circuit 42, is lower than a set voltage Vs that is set at the rated voltage or the allowable upper limit voltage of the main IGBT 21m, the sense IGBT 21s, and semiconductor elements that constitute the input determination circuit 36, the protection control circuit 37, and the gate control circuit 38.

The second voltage divider circuit 45 is made up of two resistors 45a and 45b that are connected in series between the connection point of the resistor 42a of the first voltage divider circuit 42 and the gate terminal tg, which serves as an input terminal, and the low potential side wiring 22. The connection point of the resistors 45a and 45b is connected to the gate, which is a control terminal of the semiconductor switching element 43.

With regard to the second voltage divider circuit 45, the resistance values of the resistors 45a and 45b are set such that, when a high voltage that is not lower than the afore-described set voltage Vs is applied between the resistor 42a and the gate terminal tg, a second divided voltage Vb that is output from the connection point of the resistors 45a and 45b becomes not lower than a gate threshold voltage that causes the semiconductor switching element 43 to be brought to a conductive state.

Next, an operation of the above-described first embodiment will be described.

It is now assumed that the gate terminal tg, which serves as an input terminal, and the control wiring 24 are in a normal state that is not a short-to-supply state. In the normal state, the control voltage Vco applied to the control wiring 24 is lower than the set voltage Vs. For this reason, in the short-to-supply protection circuit 41, the second divided voltage Vb at a connection point B of the resistors 45a and 45b of the second voltage divider circuit 45 is lower than the gate threshold voltage of the semiconductor switching element 43. In consequence, the semiconductor switching element 43 maintains the OFF state, and the first voltage divider circuit 42 stops a voltage dividing operation.

When, in the normal state, a gate signal that is applied to the gate terminal tg from an external control device is at a low level, electric charges accumulated in the parasitic gate capacitors of the main IGBT 21m and the sense IGBT 21s are discharged. For this reason, the main IGBT 21m and the sense IGBT 21s maintain the OFF state, and supply of the battery voltage VB of the battery 11 to the primary coil 13a of the ignition coil 13 is stopped. In addition, since the gate signal is at the low level, the input determination circuit 36, the protection control circuit 37, and the gate control circuit 38 are not supplied with a power supply voltage and are thus put in an operation stop state.

When the gate signal rises to a high level (for example, 5 V) from the above-described state, the gate signal is, as the control voltage Vco, supplied to the input determination circuit 36, the protection control circuit 37, and the gate control circuit 38 via the resistor 42a of the first voltage divider circuit 42 as a power supply voltage to cause these circuits to be brought to an operating state.

In this case, when the control voltage Vco, which is input to the input determination circuit 36, is lower than the threshold voltage Vth, the input determination signal Sj is kept at a low level and the gate control circuit 38 controls the semiconductor switching element 35 to be ON state. For this reason, the gate voltage Vg, which is supplied to the gates of the main IGBT 21m and the sense IGBT 21s, is kept at a low potential, and the main IGBT 21m and the sense IGBT 21s are maintained in the OFF state.

Subsequently, when the control voltage Vco, which is input to the input determination circuit 36, becomes not lower than the threshold voltage Vth, the input determination signal Sj of a high level is output to the protection control circuit 37 and the gate control circuit 38.

In the protection control circuit 37, a timer circuit starts counting based on the input determination signal Sj of a high level. The gate control circuit 38 brings the semiconductor switching element 35 to the OFF state based on the input determination signal Sj of a high level. For this reason, the control voltage Vco is applied to the gates of the main IGBT 21m and the sense IGBT 21s as the gate voltage Vg to cause the main IGBT 21m and the sense IGBT 21s to be brought to the turn-on state.

Therefore, the collector current Ic starts flowing from the battery 11 to the collector of the main IGBT 21m via the primary coil 13a of the ignition coil 13 and via the collector terminal tc of the semiconductor device 20. With regard to the collector current Ic, dI/dt is determined by inductance and voltage applied across the primary coil 13a of the ignition coil 13.

With regard to a collector voltage Vc, the collector voltage Vc rises gradually in accordance with a rate of change in magnetic flux L(di/dt) where L denotes the inductance of the ignition coil 13 and is subsequently kept at a constant voltage that is a low voltage of, for example, 3 to 5 V.

While the main IGBT 21m is controlled to be in the ON state, electromagnetic energy is accumulated in the primary coil 13a of the ignition coil 13. Subsequently, when the gate signal returns to the low level at a point of time when a predetermined ignition duration Ts has passed, the gate voltage of the main IGBT 21m and the sense IGBT 21s is, in response to the return, drawn to the external control device side via the speed-up diode 33 rapidly. The above operation causes the main IGBT 21m and the sense IGBT 21s to be turned off.

For this reason, the collector current Ic flowing through the main IGBT 21m decreases steeply, and the steep change in the collector current Ic causes a voltage across the primary coil of the ignition coil 13 to rise steeply to several hundreds of V due to self-induction effect. At the same time, a voltage across a secondary coil 13b rises to several tens of kV due to mutual induction effect, and the voltage is applied to the ignition device 12. The ignition device 12 generates spark discharge when having an applied voltage of several tens of kV or higher to drive an internal combustion engine.

In such a regular ignition operation, the on-time duration of the gate signal is set at such a duration that the collector current Ic does not reach the current limit value $I_{LIM}$. For this reason, the gate signal of the semiconductor switching element 35 maintains low level in the gate control circuit 38, the semiconductor switching element 35 maintains the OFF state, and the current limit operation is stopped. Similarly, when the protection control circuit 37 has not detected an over temperature state and the on-time duration of the gate signal is shorter than the preset duration, the shut-off signal Ss is not output from the protection control circuit 37 to the gate control circuit 38 and the semiconductor switching element 35 maintains the OFF state.

While the above is a description of the regular ignition operation, when a failure has occurred to the external control device and causes a situation in which the length of the on-time duration of the gate signal, which is input to the gate terminal tg, exceeds a length of the on-time duration in the regular operation, a protection operation described below is performed.

That is, when the gate signal is brought to the ON state and the control voltage Vco, which is input to the input determination circuit 36, rises to the threshold voltage Vth or higher, the input determination signal Sj of a high level is input to the protection control circuit 37. For this reason, the timer circuit in the protection control circuit 37 starts counting.

When the gate signal is kept in the ON state longer than the predetermined ignition duration Ts in the regular operation, the on-time duration of the main IGBT 21m and the sense IGBT 21s becomes long to cause the collector current Ic to increase. Detection of the collector current Ic as a voltage signal by the current detecting resistor 34, which is connected to the emitter of the sense IGBT 21s, and input of the detected voltage signal to the gate control circuit 38 cause a current limit operation to be started.

The current limit operation on/off controls the semiconductor switching element 35 such that the collector current Ic is kept at a limit current Is (for example, 12 A). The current limit operation suppresses heat generation from the power semiconductor chip 25.

When the gate signal is continuously kept in the ON state even after the current limit operation has been started, the timer circuit is caused to time out or temperature detected by the over temperature detection unit is caused to reach a preset temperature in the protection control circuit 37. For this reason, at a point of time when the timer circuit times out or over temperature is detected, the shut-off signal Ss of a high level is output from the protection control circuit 37 to the gate control circuit 38. Therefore, a gate signal of a high level is output from the gate control circuit 38 to the semiconductor switching element 35 and the semiconductor switching element 35 is brought to the ON state, which causes the main IGBT 21m and the sense IGBT 21s to be turned off immediately.

Furthermore, when the semiconductor device is brought to a short-to-supply state, in which either one of the gate terminal tg, which serves as an input terminal, and the control wiring 24 is connected to the power supply system from the battery 11, the control voltage Vco in the control wiring 24 rises to, for example, 16 V. When, for this reason, the control voltage Vco in the control wiring 24 exceeds the set voltage Vs, the second divided voltage Vb at the connection point B of the resistors 45a and 45b of the second voltage divider circuit 45 reaches a gate threshold voltage Vgth of the semiconductor switching element 43 or higher. Therefore, the semiconductor switching element 43 is brought to the ON state, and the resistor 42b of the first voltage divider circuit 42 is connected to the low potential side wiring 22 via the semiconductor switching element 43.

As a consequence, the first voltage divider circuit 42 starts a voltage dividing operation, and the first divided voltage Va, which is output from the connection point A of the resistors 42a and 42b, instead of coinciding with the battery voltage VB, is limited to not greater than the set voltage Vs, which is set at the rated voltage or the allowable upper limit voltage of the main IGBT 21m, the sense IGBT 21s, and the respective constituent components of the element drive unit 31. The set voltage Vs is applied to not only the gates of the main IGBT 21m and the sense IGBT 21s but also the semiconductor switching elements that constitute the semiconductor switching element 35, the input determination circuit 36, the protection control circuit 37, and the gate control circuit 38 through the control wiring 24.

Therefore, even when a short-to-supply has occurred to either one of the gate terminal tg, which serves as an input terminal, and the control wiring 24, a voltage applied to the main IGBT 21m, the sense IGBT 21s, and the respective constituent components of the element drive unit 31 is limited to not greater than the set voltage Vs. Thus, it may be possible to securely protect the main IGBT 21m, the sense IGBT 21s, and the respective constituent components of the element drive unit 31 from being destroyed.

As described above, according to the above-described first embodiment, when a voltage applied to the control wiring 24 exceeds the set voltage Vs, the semiconductor switching element 43 is brought to a conductive state and the first voltage divider circuit 42 starts the voltage dividing operation to limit a control voltage applied to the control wiring to not greater than the set voltage Vs, which enables the main IGBT 21m, the sense IGBT 21s, and the respective constituent components of the element drive unit 31 to be protected securely.

Figure 2:
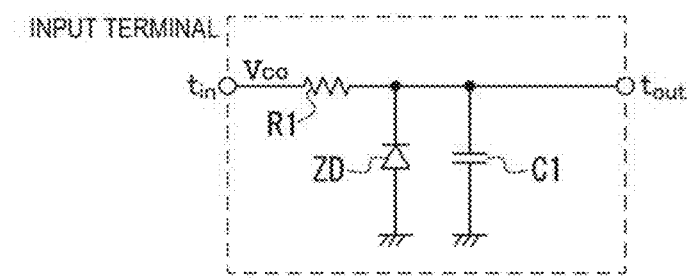
FIG. 2 is a circuit diagram illustrative of an individual short-to-supply protection circuit.

Incidentally, when the short-to-supply protection circuit 41 according to the present embodiment is not disposed, it is required to at least dispose a short-to-supply protection circuit to each of the input determination circuit 36, the protection control circuit 37, and the gate control circuit 38 individually. The individual short-to-supply protection circuit in this case is made up of a low pass filter LPF that is disposed between an input terminal tin and an output terminal tout and is, as described in JP 2016-1635 A, made up of a resistor R1 and a capacitor C1 and a Zener diode ZD that is connected in parallel with the capacitor C1 and limits the control voltage Vco to the set voltage Vs, as illustrated in FIG. 2. Therefore, the number of short-to-supply protection circuits increases and the chip size of the control semiconductor chip 30 is enlarged.

On the other hand, the present embodiment requires disposing only one short-to-supply protection circuit that is made up of four resistors and a semiconductor switching element 43 that constitute the first voltage divider circuit 42 and the second voltage divider circuit 45, which enables the semiconductor chip size to be reduced.

In addition, since the control voltage Vco, which is applied to the control wiring 24 on the side where the sense IGBT 21s is disposed, never exceeds the set voltage Vs in the present embodiment, disposing only one speed-up diode 33 with a breakdown voltage of, for example, 7 V is required, and the conduction resistance of the diode 33 never influences the turning off of the main IGBT 21m and the sense IGBT 21s.

On the other hand, when the short-to-supply protection circuit 41 is not disposed, a short-to-supply causes a voltage of, for example, 16 V to be applied to the control wiring 24, which requires the speed-up diode 33 to be configured by connecting three stages of diodes with a breakdown voltage of 7 V. When the speed-up diode is configured in such a three stage configuration, connecting three diodes each of which is assumed to have a forward voltage Vf of 0.7 V in series causes a forward voltage of the three stages of diodes to be 0.7 V×3=2.1 V, which leads to a possibility that a voltage not lower than a turn-on threshold voltage of the main IGBT 21m and the sense IGBT 21s being applied disables a collector current through the main IGBT 21m and the sense IGBT 21s from being cut off speedily.

Next, a second embodiment of the present invention will be described using FIG. 3.

The second embodiment is an embodiment in which the configuration of the second voltage divider circuit 45 is changed to a series circuit made up of a Zener diode and a resistor.

Figure 3:
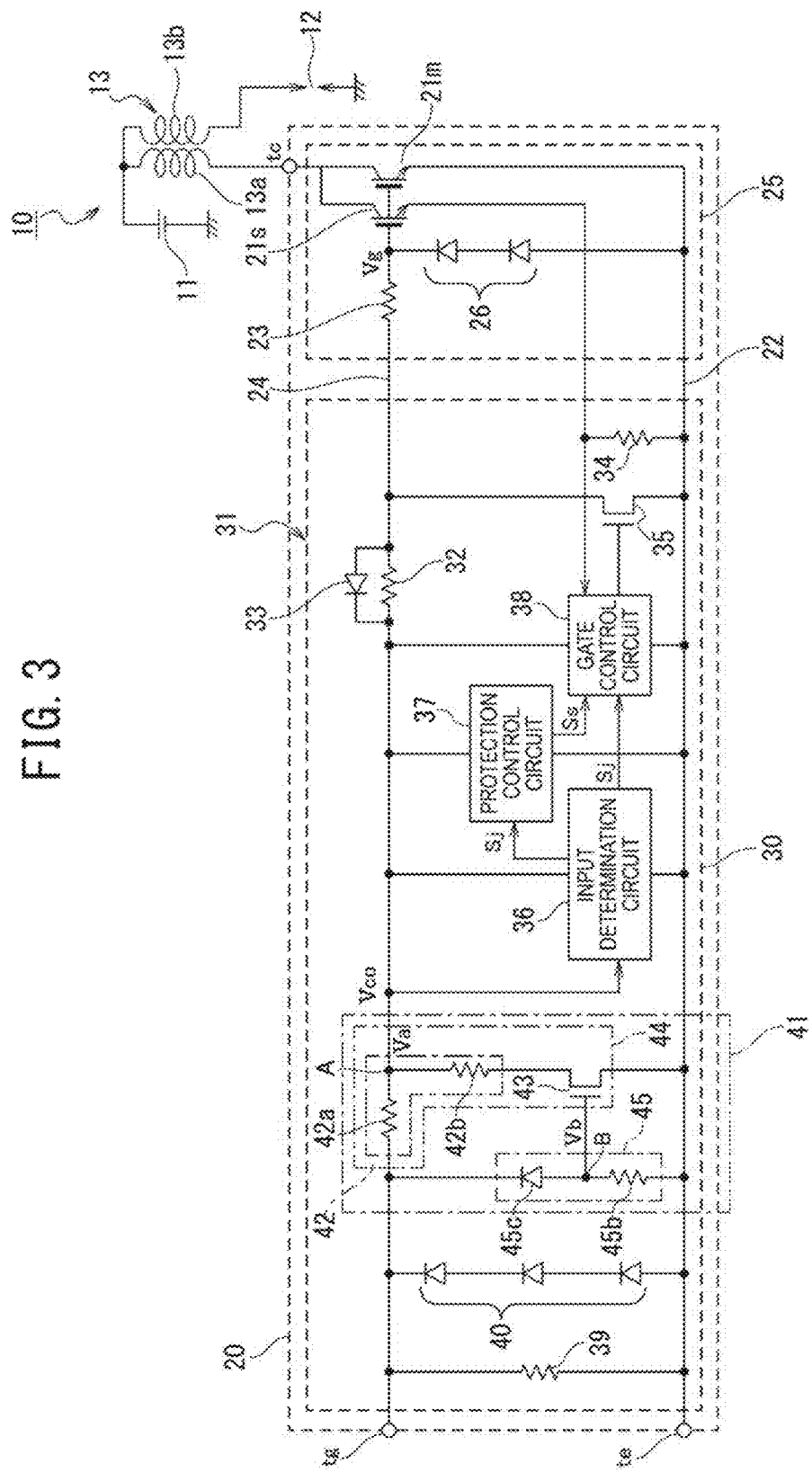
FIG. 3 is a circuit diagram illustrative of an ignition control device for an internal combustion engine that includes a semiconductor device according to a second embodiment of the present invention.

That is, in the second embodiment, as illustrated in FIG. 3, the resistor 45a of the second voltage divider circuit 45 in the afore-described first embodiment is omitted, and, in place of the resistor 45a, a Zener diode 45c is disposed. The breakdown voltage of the Zener diode 45c is set at, for example, 7 V, which is equal to a set voltage Vs that is set at a rated voltage or an allowable upper limit voltage of a main IGBT 21m, a sense IGBT 21s, an input determination circuit 36, a protection control circuit 37, and a gate control circuit 38 that are connected to a control wiring 24.

The cathode and anode of the Zener diode 45c are connected to between a resistor 42a of a first voltage divider circuit 42 and a gate terminal tg that serves as an input terminal and to a connection point B of a resistor 45b and the gate of a semiconductor switching element 43, respectively.

A dynamic resistance value of the Zener diode 45c and a resistance value of the resistor 45b in the second voltage divider circuit 45 are set such that, when a voltage across the second voltage divider circuit 45 is not greater than the set voltage Vs, a second divided voltage Vb output from the connection point B becomes lower than a turn-on threshold voltage of the semiconductor switching element 43, and, when the voltage across the second voltage divider circuit 45 exceeds the set voltage Vs, the second divided voltage Vb becomes not lower than the turn-on threshold voltage of the semiconductor switching element 43.

The other configuration of the second embodiment is the same as that of the first embodiment, and, in FIG. 3, the same reference signs are assigned to the same constituent components as those in FIG. 1 and a detailed description thereof will be omitted.

According to the second embodiment, in a normal state in which a control voltage supplied to the gate terminal tg, which serves as an input terminal, and the control wiring 24 is not greater than the set voltage Vs, the Zener diode 45c in the second voltage divider circuit 45 maintains a non-conductive state. For this reason, the second divided voltage Vb output from the connection point B of the Zener diode 45c and the resistor 45b becomes a low potential of a low potential side wiring 22.

Therefore, in a normal condition, the same operation as that in the afore-described first embodiment is performed, and a current limit operation when the on-time duration of a gate signal becomes long is also performed in the same manner as in the afore-described first embodiment.

On the other hand, when the normal state has changed to a short-to-supply state in which the gate terminal tg, which serves as an input terminal, or the control wiring 24 is connected to a power supply system from a battery 11, a control voltage Vco of the control wiring 24 is, regardless of whether the gate signal is in the ON state or the OFF state, caused to increase rapidly, exceeding the set voltage Vs (for example, 7 V), to 16 V. For this reason, the second voltage divider circuit 45 monitors the control voltage Vco of the control wiring 24, and, at a point of time when the control voltage Vco exceeds the set voltage Vs, the Zener diode 45c of the second voltage divider circuit 45 is brought to a conductive state. Therefore, the second divided voltage Vb, which is output from the connection point B, becomes not lower than a turn-on threshold voltage of the semiconductor switching element 43 to cause the semiconductor switching element 43 to be brought to the ON state immediately.

For this reason, a resistor 42b is connected to the low potential side wiring 22 via the semiconductor switching element 43, and the first voltage divider circuit 42 thus starts a voltage dividing operation to control a first divided voltage Va that is output from the connection point A of the resistors 42a and 42b to the set voltage Vs or lower. The first divided voltage Va is supplied to the main IGBT 21m, the sense IGBT 21s, the input determination circuit 36, the protection control circuit 37, and the gate control circuit 38 through the control wiring 24.

Therefore, even when a short-to-supply occurs to a portion of the control wiring 24 between the gate terminal tg, which serves as an input terminal, and the first voltage divider circuit 42, the control voltage Vco, which is supplied to the main IGBT 21m, the sense IGBT 21s, the input determination circuit 36, the protection control circuit 37, and the gate control circuit 38, is securely limited to the set voltage Vs or lower. As a consequence, when a short-to-supply occurs, the main IGBT 21m, the sense IGBT 21s, the input determination circuit 36, the protection control circuit 37, and the gate control circuit 38 may be securely protected. Therefore, in the second embodiment, the same operational effects as those in the afore-described first embodiment may also be achieved.

Next, a third embodiment of the present invention will be described using FIG. 4.

The third embodiment is an embodiment in which the second voltage divider circuit 45 in the first embodiment is configured to be connected to Zener diodes that protect a control semiconductor chip 30 against ESD (electro-static discharge).

Figure 4:
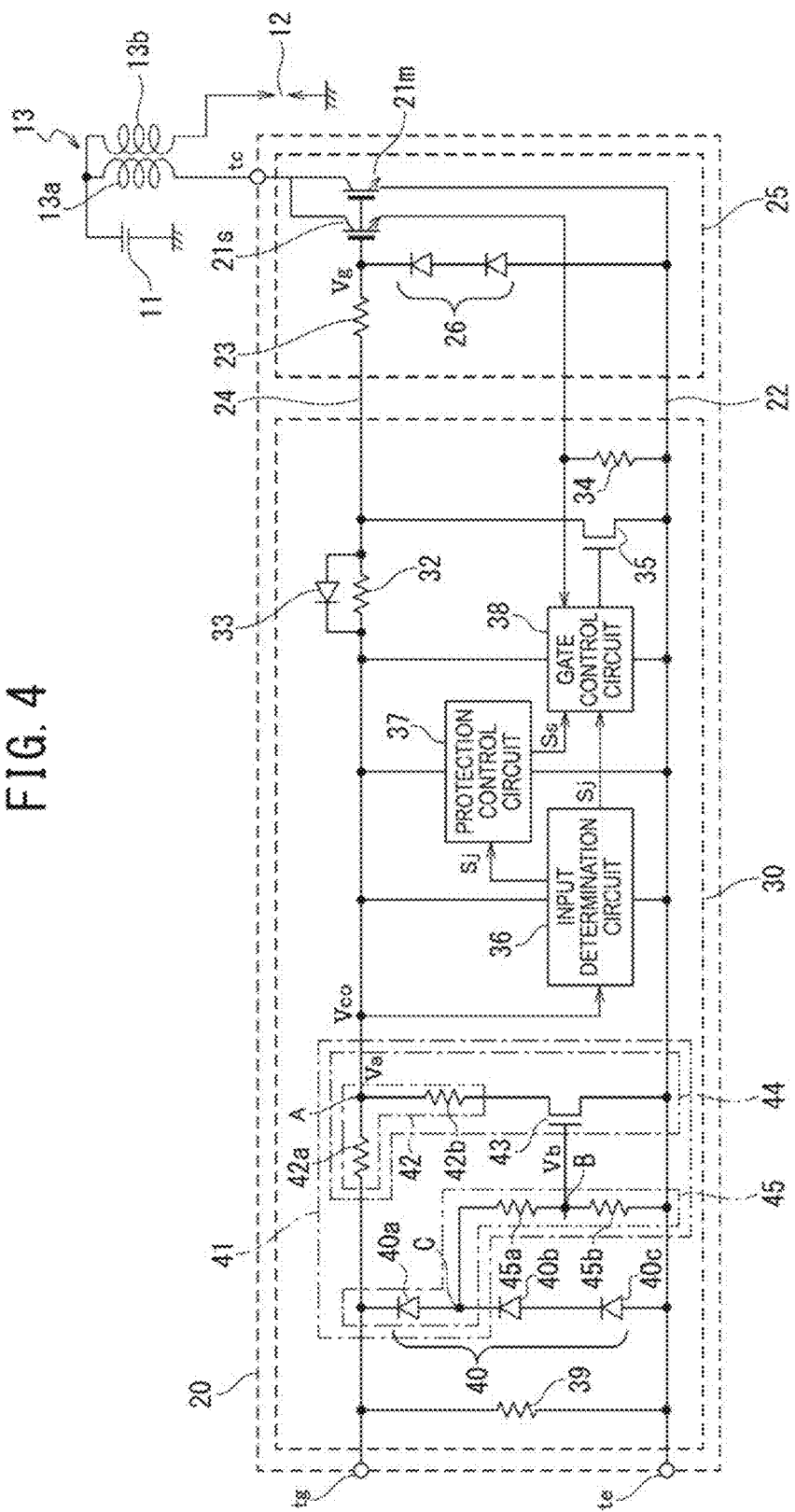
FIG. 4 is a circuit diagram illustrative of an ignition control device for an internal combustion engine that includes a semiconductor device according to a third embodiment of the present invention.

That is, in the third embodiment, as illustrated in FIG. 4, in place of connecting the resistor 45a constituting the second voltage divider circuit 45 to the control wiring 24 as in the above-described first embodiment, a resistor 45a constituting a second voltage divider circuit 45 is connected to a connection point C of a Zener diode 40a disposed on the side where the control wiring 24 is wired and a Zener diode 40b adjacent to the Zener diode 40a in a Zener diode group 40 that protects the control semiconductor chip 30 against ESD (electro-static discharge). In the above, resistance values of the resistor 45a and a resistor 45b of the second voltage divider circuit 45 are set at such values that, when an excessive voltage exceeding a set voltage Vs is input via the Zener diode 40a, a second divided voltage Vb becomes not lower than a turn-on threshold voltage of a semiconductor switching element 43.

The other configuration of the third embodiment is the same as that of the first embodiment, and, in FIG. 4, the same reference signs are assigned to the same constituent components as those in FIG. 1 and a detailed description thereof will be omitted.

According to the third embodiment, the resistor 45a, which constitutes the second voltage divider circuit 45, is connected to the connection point C of the Zener diode 40a, which is disposed on the side where the control wiring 24 is wired, and the Zener diode 40b, which is adjacent to the Zener diode 40a, in the Zener diode group 40, which protects the control semiconductor chip 30 against ESD (electro-static discharge). Although a voltage dividing operation itself of the second voltage divider circuit 45 does not differ from that in the afore-described first embodiment, the second voltage divider circuit 45 is different from that in the first embodiment in that a voltage is supplied to the second voltage divider circuit 45 only when a control voltage of the control wiring 24 exceeds the set voltage Vs, which is equal to a breakdown voltage of the Zener diode 40a. For this reason, when the control voltage of the control wiring 24 exceeds the set voltage Vs, the semiconductor switching element 43 is controlled to the ON state. Therefore, the same operational effects as those in the first embodiment may be achieved.

In addition, a current that flows through the second voltage divider circuit 45 to an emitter terminal to in a normal condition may be suppressed. When, as with the first embodiment, the second voltage divider circuit 45 is connected in parallel with a pull-down resistor 39, another current path is formed in addition to the pull-down resistor 39, which causes the input impedance of a gate terminal tg that serves as an input terminal to be lowered to a value lower than the pull-down resistor 39. According to the third embodiment, however, since no current path is formed in parallel with the pull-down resistor 39 in the normal condition, an accurate input impedance may be determined.

Next, a fourth embodiment of the present invention will be described using FIG. 5.

The fourth embodiment is an embodiment in which a second voltage divider circuit is configured using the afore-described pull-down resistor, which determines an input impedance of a gate terminal tg that serves as an input terminal.

Figure 5:
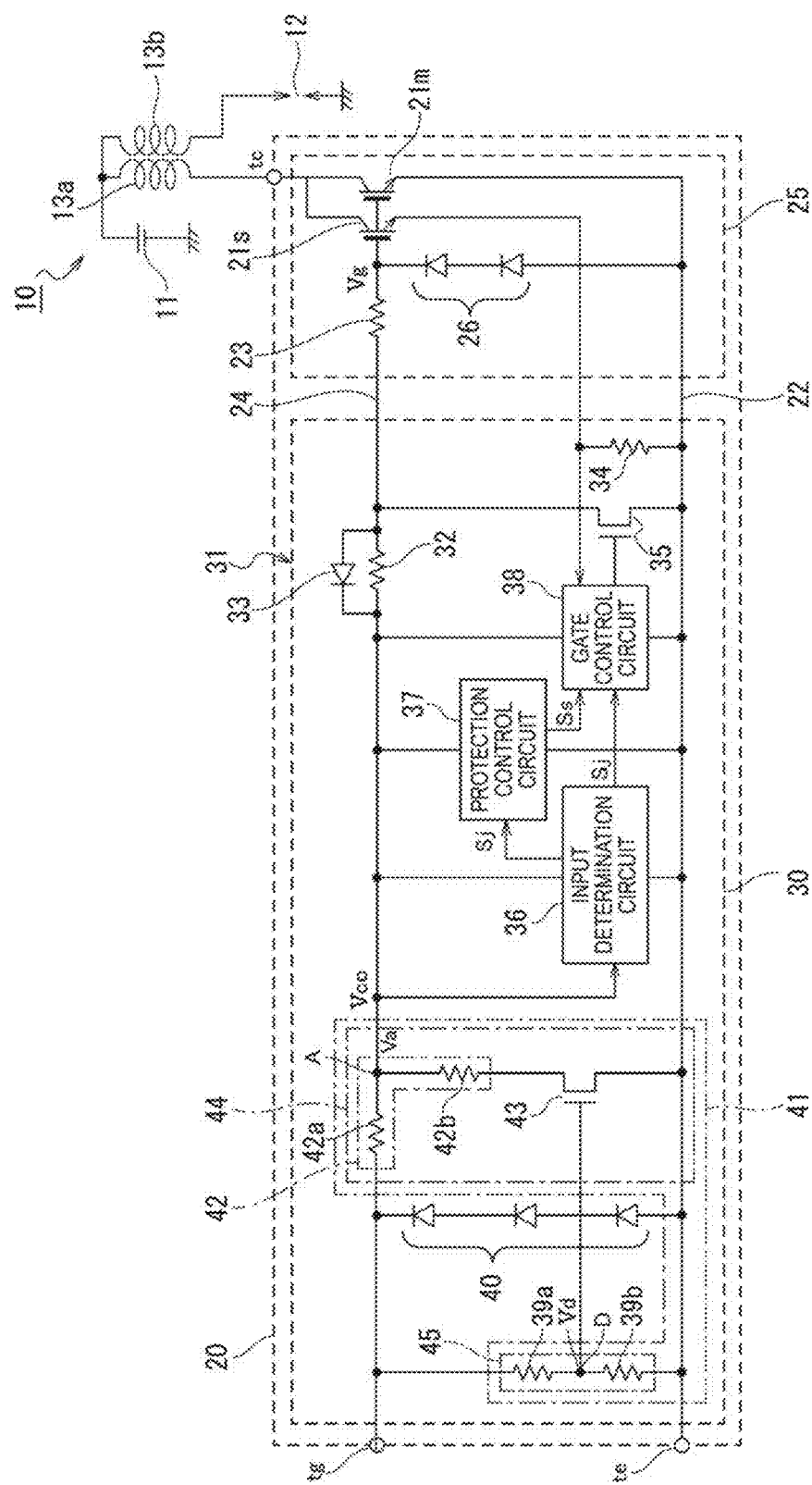
FIG. 5 is a circuit diagram illustrative of an ignition control device for an internal combustion engine that includes a semiconductor device according to a fourth embodiment of the present invention.

That is, in the fourth embodiment, as illustrated in FIG. 5, by dividing a pull-down resistor 39 into two resistors, i.e., a first resistor 39a and a second resistor 39b, and arranging the two resistors in series, a second voltage divider circuit 45 is formed. Further, a connection point D of the first resistor 39a and the second resistor 39b is connected to the gate of a semiconductor switching element 43.

Resistance values of the first resistor 39a and the second resistor 39b are set at such values that the combined resistance value thereof is equal to the resistance value of the pull-down resistor 39, when a control voltage Vco of a control wiring 24 is not greater than a set voltage Vs, a second divided voltage Vd that is output from the connection point D becomes lower than a turn-on threshold voltage of the semiconductor switching element 43, and, when the control voltage Vco of the control wiring 24 exceeds the set voltage Vs, the second divided voltage Vd, which is output from the connection point D, becomes not lower than the turn-on threshold voltage of the semiconductor switching element 43.

Since the fourth embodiment has practically the same configuration as that in the afore-described first embodiment except that the second voltage divider circuit 45 is configured using the pull-down resistor 39, the same operational effects as those in the afore-described first embodiment may be achieved.

In addition, in the fourth embodiment, differing from the afore-described first embodiment, it is not required to connect the second voltage divider circuit 45 in parallel with the pull-down resistor 39. For this reason, the number of components constituting the second voltage divider circuit 45 may be reduced. In addition, when the second voltage divider circuit 45 is connected in parallel with the pull-down resistor 39 as in the first embodiment, another current path is formed in addition to the pull-down resistor 39, which causes the input impedance of a gate terminal tg that serves as an input terminal to be lowered to a value lower than the pull-down resistor 39. According to the fourth embodiment, however, since no current path is formed in parallel with the pull-down resistors 39a and 39b, an accurate input impedance may be determined.

Figure 6:
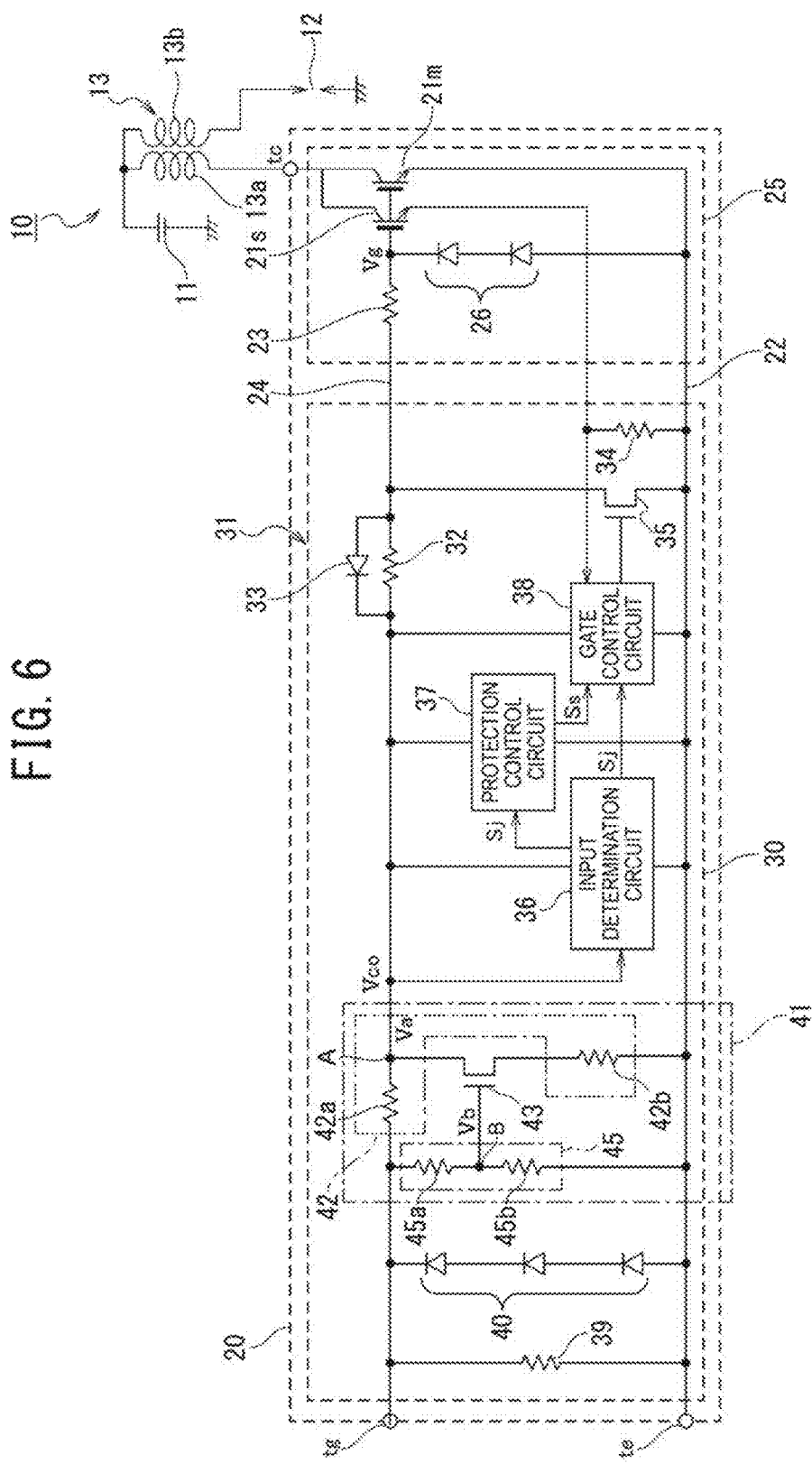
FIG. 6 is a circuit diagram illustrative of an ignition control device for an internal combustion engine that includes a semiconductor device according to a fifth embodiment of the present invention.

Next, a fifth embodiment of the present invention will be described using FIG. 6.

The fifth embodiment is an embodiment in which a connection position at which a semiconductor switching element is connected to a first voltage divider circuit is altered.

That is, in the fifth embodiment, the connection position of the semiconductor switching element 43 is altered from the position in the configurations in the afore-described first to fourth embodiments in which the semiconductor switching element 43 is connected in series between the resistor 42b and the low potential side wiring 22 to a position in a configuration in which the semiconductor switching element 43 is connected in series between the resistor 42b and the control wiring 24.

In the fifth embodiment, a first voltage divider circuit 42 is also configured to, when a control voltage Vco of the control wiring 24 is not greater than a set voltage Vs, cause a second divided voltage Vb of a second voltage divider circuit 45 to become lower than a threshold voltage of a semiconductor switching element 43. For this reason, the semiconductor switching element 43 maintains the OFF state and a current path between a connection point A and a low potential side wiring 22 is cut off, which causes a voltage dividing operation to be stopped.

On the other hand, when the control voltage Vco of the control wiring 24 exceeds the set voltage Vs, the second divided voltage Vb of the second voltage divider circuit 45 rises to the threshold voltage of the semiconductor switching element 43 or higher. For this reason, the semiconductor switching element 43 is brought to the ON state, and a resistor 42b is connected to the connection point A through the semiconductor switching element 43. Therefore, the first voltage divider circuit 42 starts the voltage dividing operation, and a first divided voltage Va that is output from the connection point A is controlled to the set voltage Vs or lower.

Therefore, when a short-to-supply has occurred and an excessive voltage exceeding the set voltage Vs is applied to a gate terminal tg that serves as an input terminal and the control wiring 24, the excessive voltage may be suppressed to the set voltage Vs or lower by the first voltage divider circuit 42. For this reason, it may be possible to securely prevent the excessive voltage from being supplied to a main IGBT 21m, a sense IGBT 21s, an input determination circuit 36, a protection control circuit 37, and a gate control circuit 38 to protect these circuits.

Next, a sixth embodiment of the present invention will be described using FIG. 7.

The sixth embodiment is an embodiment in which a function for cancelling temperature dependence of a gate threshold voltage of a semiconductor switching element 43 is added to a second voltage divider circuit.

Figure 7:
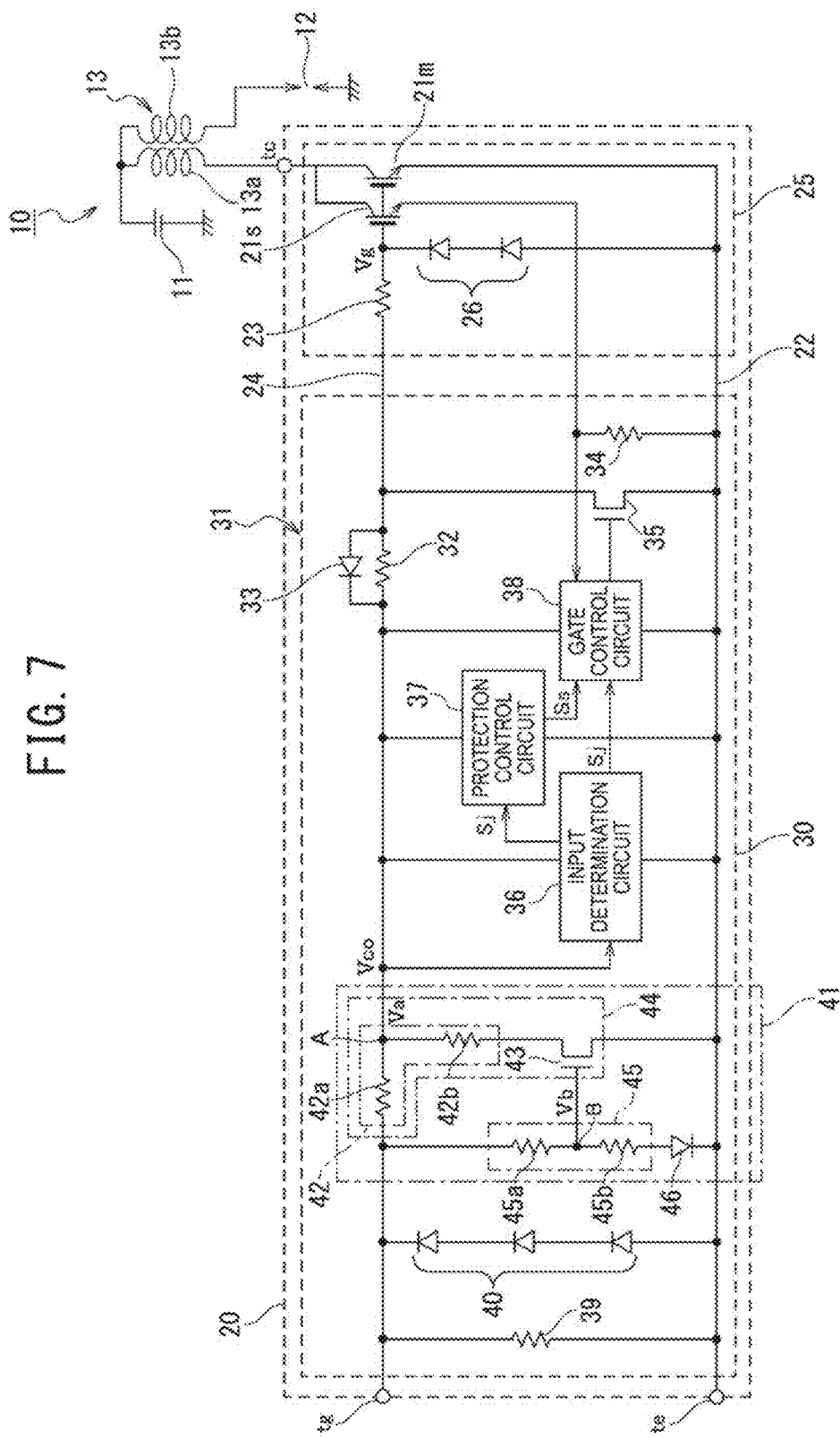
FIG. 7 is a circuit diagram illustrative of an ignition control device for an internal combustion engine that includes a semiconductor device according to a sixth embodiment of the present invention.

That is, in the sixth embodiment, as illustrated in FIG. 7, between a resistor 45b of a second voltage divider circuit 45 and a low potential side wiring 22, a diode 46 that cancels the temperature dependence of the gate threshold voltage of the semiconductor switching element 43 is connected in the forward direction with the anode and cathode thereof being connected to the resistor 45b and the low potential side wiring 22, respectively. In the above, the diode 46 has constants, such as a forward voltage Vf, a size, the number of series, and the number of parallels, set so as to be able to cancel the temperature dependence of the gate threshold voltage of the semiconductor switching element 43.

The second voltage divider circuit 45 is configured such that, when a high voltage not lower than the afore-described set voltage Vs is applied between a gate terminal tg and an emitter terminal te, a second divided voltage Vb that is expressed using the voltages generated at a resistor 45a and the sum of resistor 45b and the forward voltage Vf of the diode 46 becomes not lower than the gate threshold voltage, which brings the semiconductor switching element 43 to a conductive state, in the second voltage divider circuit 45.

The other configuration of the sixth embodiment is the same as that of the first embodiment, and the same reference signs are assigned to the same constituent components as those in FIG. 1 and a detailed description thereof will be omitted.

According to the sixth embodiment, although a gate threshold voltage Vgth of the semiconductor switching element 43 has a negative temperature dependence, the forward voltage Vf of the diode 46 also has a negative temperature coefficient, and thus, proper setting of the constants of the diode 46 (a forward voltage Vf, a size, the number of series, and the number of parallels) enables the temperature dependence of the gate threshold voltage Vgth of the semiconductor switching element 43 to be canceled.

Therefore, a short-to-supply protection circuit that does not depend on the temperature of a device may be provided.

Next, a seventh embodiment of the present invention will be described using FIG. 8.

The seventh embodiment is an embodiment in which, as an element that cancels temperature dependence of a gate threshold voltage of a semiconductor switching element in the above-described sixth embodiment, a semiconductor switching element in diode connection is applied in place of a diode.

Figure 8:
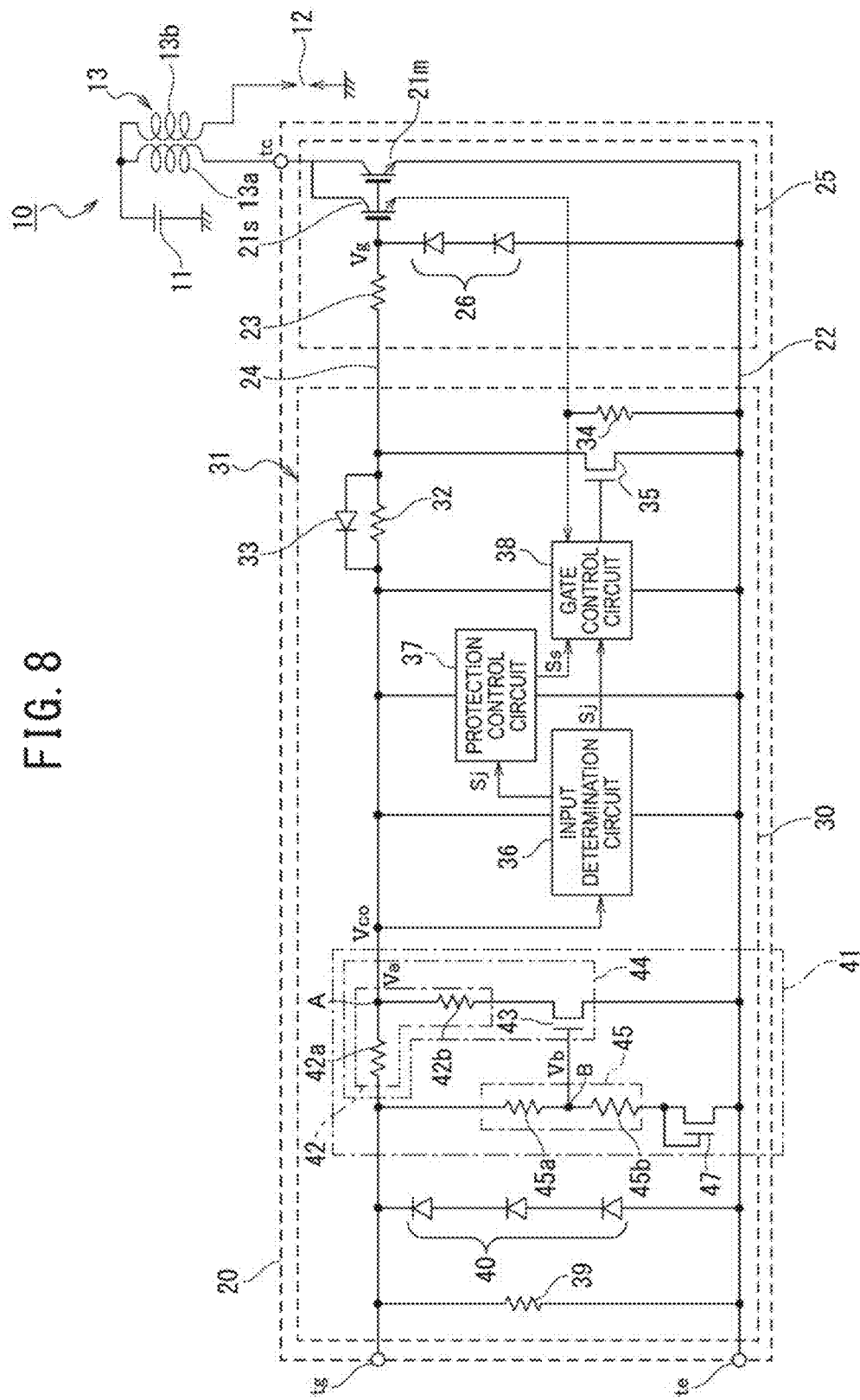
FIG. 8 is a circuit diagram illustrative of an ignition control device for an internal combustion engine that includes a semiconductor device according to a seventh embodiment of the present invention.

That is, in the seventh embodiment, as illustrated in FIG. 8, the diode in the afore-described seventh embodiment is omitted, and, in place thereof, a semiconductor switching element 47 in diode connection is connected.

As the semiconductor switching element 47 in diode connection, an N-channel MOSFET of the same type as a semiconductor switching element 43 is applied, and a ratio W/L of a channel width W to a channel length L of the semiconductor switching element 47 is also set at the same value as that of the semiconductor switching element 43. The drain, source, and gate of the semiconductor switching element 47 are connected to a resistor 45b, a low potential side wiring 22, and the drain, respectively.

In the seventh embodiment, a second voltage divider circuit 45 is also configured such that, when a high voltage not lower than the afore-described set voltage Vs is applied between a gate terminal tg and an emitter terminal te, a second divided voltage Vb that is expressed using the voltages generated at a resistor 45a and the sum of resistor 45b and a forward voltage Vf of the semiconductor switching element 47 in diode connection becomes not lower than a gate threshold voltage that brings the semiconductor switching element 43 to a conductive state in the second voltage divider circuit 45.

The other configuration of the seventh embodiment is the same as that of the afore-described sixth embodiment, and the same reference signs are assigned to the same constituent components as those in FIG. 7 and a detailed description thereof will be omitted.

According to the seventh embodiment, as an element that cancels temperature dependence of a gate threshold voltage Vgth of the semiconductor switching element 43, the semiconductor switching element 47, which is of the same type as and has an identical ratio W/L of a channel width to a channel length with the semiconductor switching element 43, configured in diode connection is applied. For this reason, the semiconductor switching element 47 has the same temperature dependence as the temperature dependence of the gate threshold voltage Vgth of the semiconductor switching element 43, which enables the temperature dependence of the gate threshold voltage Vgth of the semiconductor switching element 43 to be accurately canceled.

The configuration of the second voltage divider circuit 45 is not limited to the one in the first embodiment, and, even in the configurations in the second to fifth embodiments, a diode or a semiconductor switching element in diode connection may be connected in the forward direction between a resistor on the low potential side and the low potential side wiring 22.

In the above-described first to seventh embodiments, cases in which three protection functions, that is, the current limit function for the main IGBT 21m, the over temperature protection function for the power semiconductor chip 25, and the timer shut-off function for a case in which the on-time duration of an input signal becomes long, are included as protection functions for the main IGBT 21m were described. However, the present invention is not limited to the above-described three protection functions, and not only may one or plural protection functions out of the three protection functions be used but also another protection function may be added.

Although, in the above-described first to seventh embodiments, cases in which an IGBT is applied as a voltage-control type semiconductor element were described, the present invention is not limited to the cases, and a power MOSFET and a wide band gap semiconductor element, such as a SiC semiconductor, a GaN-based semiconductor, and a diamond semiconductor, may be applied.

The semiconductor switching element 43 connected in series with the first voltage divider circuit 42 is not limited to a MOSFET, and another arbitrary semiconductor switching element may be applied.

Although, in the above-described first to seventh embodiments, cases in which the semiconductor device 20 is made up of two chips, that is, the power semiconductor chip 25 and the control semiconductor chip 30, were described, the semiconductor device 20 may be configured in one chip by integrating the power semiconductor chip 25 and the control semiconductor chip 30.

The Zener diode constituting the second voltage divider circuit 45 may be replaced with a MOSFET in diode connection.

Although, in the above-described first to seventh embodiments, cases in which the present invention is applied to an ignition control device were described, the embodiments are not limited to the cases, and the present invention may also be applied to a control device that drives another type of inductive load.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

REFERENCE SIGNS LIST

10 Ignition control device
11 Battery
12 Ignition device
13 Ignition coil
20 Semiconductor device
21m Main IGBT
21s Sense IGBT
22 Low potential side wiring
23 Gate resistor
24 Control wiring
25 Power semiconductor chip
30 Control semiconductor chip
31 Element drive unit
32 Resistor
33 Speed-up diode
34 Current detecting resistor
35 Semiconductor switching element
36 Input determination circuit
37 Protection control circuit
38 Gate control circuit
39 Pull-down resistor
39a, 39b Resistor
40 Zener diode group
40a, 40b, 40c Zener diode
41 Short-to-supply protection circuit
42 First voltage divider circuit
42a, 42b Resistor
43 Semiconductor switching element
45 Second voltage divider circuit
45a, 45b Resistor
45c Zener diode
46 Diode
47 Semiconductor switching element in diode connection

The invention claimed is:

1. A semiconductor device, comprising:
a voltage-control type semiconductor element configured to drive a load; and
an element drive unit to which a control signal for a control terminal of the voltage-control type semiconductor element is input and configured to control the control terminal of the voltage-control type semiconductor element using the control signal, the element drive unit including:
a control circuit that is driven using the control signal as a power supply,
an input terminal to which the control signal is input,
a low potential side terminal to which a low potential side terminal of the voltage-control type semiconductor element is connected,
a first voltage divider circuit that is connected between the input terminal and the low potential side terminal of the element drive unit and is configured such that a first divided voltage is not greater than a set voltage for protecting the voltage-control type semiconductor element and the control circuit,
a semiconductor switching element configured to control a voltage dividing operation performed by the first voltage divider circuit, and
a second voltage divider circuit configured to, when a voltage that exceeds the set voltage is input to the input terminal, output a second divided voltage to a control terminal of the semiconductor switching element, the second divided voltage making the semiconductor switching element conductive, and the first divided voltage is supplied to the control terminal of the voltage-control type semiconductor element and the control circuit.

2. The semiconductor device according to claim 1, wherein
the first voltage divider circuit includes:
a first resistor connected between the input terminal and a connection point of the voltage-control type semiconductor element and the control circuit, and
a second resistor connected between the connection point and the low potential side terminal of the element drive unit, and
the first voltage divider circuit outputs the first divided voltage from the connection point.

3. The semiconductor device according to claim 2, wherein the semiconductor switching element is connected in series with the second resistor.

4. The semiconductor device according to claim 1, wherein the second voltage divider circuit includes two resistors connected in series, and a connection point of the two resistors is connected to the control terminal of the semiconductor switching element.

5. The semiconductor device according to claim 1, wherein the second voltage divider circuit includes:
a Zener diode having a cathode connected between the input terminal and the first voltage divider circuit, and
a resistor connected between an anode of the Zener diode and the low potential side terminal of the element drive unit.

6. The semiconductor device according to claim 1, wherein the second voltage divider circuit includes:
a Zener diode on an input terminal side of a plurality of Zener diodes connected in series between the input terminal and the low potential side terminal of the element drive unit, and
a resistor connected between a connection point of the Zener diode and another Zener diode adjacent to the Zener diode and the low potential side terminal of the element drive unit.

7. The semiconductor device according to claim 1, wherein
the second voltage divider circuit includes a first resistor and a second resistor,
a connection point of the first resistor and the second resistor is connected to the control terminal of the semiconductor switching element,
one end of the first resistor is connected to the input terminal and one end of the second resistor is connected to the low potential side terminal of the element drive unit, and
the first resistor and the second resistor are connected in series and define an input impedance of the input terminal.

8. The semiconductor device according to claim 1, wherein the voltage-control type semiconductor element and the element drive unit are formed in semiconductor chips that are different from each other.

9. The semiconductor device according to claim 1, further comprising a semiconductor element, connected to a low potential side terminal side of the second voltage divider circuit, configured to cancel temperature dependence of a gate threshold voltage of the semiconductor switching element.

10. The semiconductor device according to claim 9, wherein the semiconductor element includes a diode connected in a forward direction.

11. The semiconductor device according to claim 9, wherein the semiconductor element includes a semiconductor switching element in diode connection.

12. The semiconductor device according to claim 11, wherein the semiconductor switching element and the semiconductor switching element in diode connection include N-channel MOSFETs of a same type.

13. The semiconductor device according to claim 1, wherein the voltage-control type semiconductor element and the element drive unit are formed in an identical semiconductor chip.

14. The semiconductor device according to claim 1, wherein the voltage-control type semiconductor element includes either one of an IGBT and a MOSFET.

15. The semiconductor device according to claim 1, wherein
the second voltage divider circuit includes a first resistor and a second resistor connected in series, and a connection point of the first resistor and the second resistor is connected to the control terminal of the semiconductor switching element, and
the element drive unit further includes a pull-down resistor connected in parallel with the second voltage divider circuit, between the input terminal and the low potential side terminal of the element drive unit, the pull-down resistor defining an input impedance of the input terminal.

16. The semiconductor device according to claim 15, wherein
the element drive unit further includes a Zener diode group to protect the semiconductor device against electro-static discharge,
the Zener diode group includes a plurality of Zener diodes connected in series, and
the Zener diode group is connected in parallel with the pull-down resistor.

* * * * *